(12) United States Patent
Mahlein et al.

(10) Patent No.: US 12,396,087 B2
(45) Date of Patent: Aug. 19, 2025

(54) PRINTED CIRCUIT BOARD AND CIRCUIT ARRANGEMENT

(71) Applicant: SEW-EURODRIVE GMBH & CO. KG, Bruchsal (DE)

(72) Inventors: Jochen Mahlein, Karlsruhe (DE); Leobald Podbielski, Karlsruhe (DE); Martin Filsinger, Kraichtal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 322 days.

(21) Appl. No.: 18/025,412

(22) PCT Filed: Sep. 2, 2021

(86) PCT No.: PCT/EP2021/074302
§ 371 (c)(1),
(2) Date: Mar. 9, 2023

(87) PCT Pub. No.: WO2022/053397
PCT Pub. Date: Mar. 17, 2022

(65) Prior Publication Data
US 2023/0337352 A1     Oct. 19, 2023

(30) Foreign Application Priority Data
Sep. 10, 2020   (DE) .......................... 102020005541.9

(51) Int. Cl.
*H05K 1/02*           (2006.01)
(52) U.S. Cl.
CPC ......... *H05K 1/0206* (2013.01); *H05K 1/0298* (2013.01); *H05K 2201/066* (2013.01)
(58) Field of Classification Search
CPC ............... H05K 1/0206; H05K 1/0298; H05K 2201/066; H05K 3/0061; H05K 3/4602
See application file for complete search history.

(56) References Cited

U.S. PATENT DOCUMENTS 5,766,740 A  *  6/1998  Olson ................. H01L 23/3735
                                                           428/209
9,907,156 B1 *  2/2018  Anand ................... H05K 1/114
(Continued)

FOREIGN PATENT DOCUMENTS

| EP | 1722612 A1 | 11/2006 |
| EP | 2911484 A2 | 8/2015 |
| WO | 2016023663 A1 | 2/2016 |

OTHER PUBLICATIONS

International Search Report issued in corresponding International Application No. PCT/EP2021/074302 dated Jan. 12, 2022, pp. 1-2, English Translation.
(Continued)

*Primary Examiner* — Jacob R Crum
(74) *Attorney, Agent, or Firm* — Carter, DeLuca & Farrell LLP

(57) ABSTRACT

A printed circuit board (PCB) includes a top side for receiving electrical components, a bottom side for receiving a heat sink, electrically conductive layers, and electrically insulating insulation layers. A main insulation layer is arranged between the top and bottom sides. The main insulation layer completely electrically insulates electrically conductive layers arranged between the main insulation layer and the top side from electrically conductive layers arranged between the main insulation layer and the bottom side. Upper plated through-holes extend from an outer insulation layer adjacent the top side into an inner insulation layer adjacent the main insulation layer. Lower plated through-holes extend from the bottom side into a lower insulation layer adjacent the main insulation layer. A circuit arrangement includes the printed circuit board, electrical
(Continued)

components fitted to the top side and connected to the PCB, and heat sink(s) fitted to the bottom side and connected to the PCB.

19 Claims, 1 Drawing Sheet

(56) References Cited

U.S. PATENT DOCUMENTS

| | | | | |
|---|---|---|---|---|
| 9,992,878 | B2* | 6/2018 | Sugane | H05K 1/162 |
| 10,117,323 | B2 | 10/2018 | Wiesa | |
| 2002/0000932 | A1* | 1/2002 | Metzen | H01P 11/003 |
| | | | | 343/846 |
| 2006/0006525 | A1* | 1/2006 | Mullen | H05K 1/0206 |
| | | | | 257/796 |
| 2016/0249445 | A1* | 8/2016 | Min | H05K 1/0204 |
| 2017/0280552 | A1* | 9/2017 | Wiesa | H01L 23/367 |

OTHER PUBLICATIONS

International Report on Patentability issued in corresponding International Application No. PCT/EP2021/074302 dated Mar. 7, 2023, pp. 1-8, English Translation.

* cited by examiner

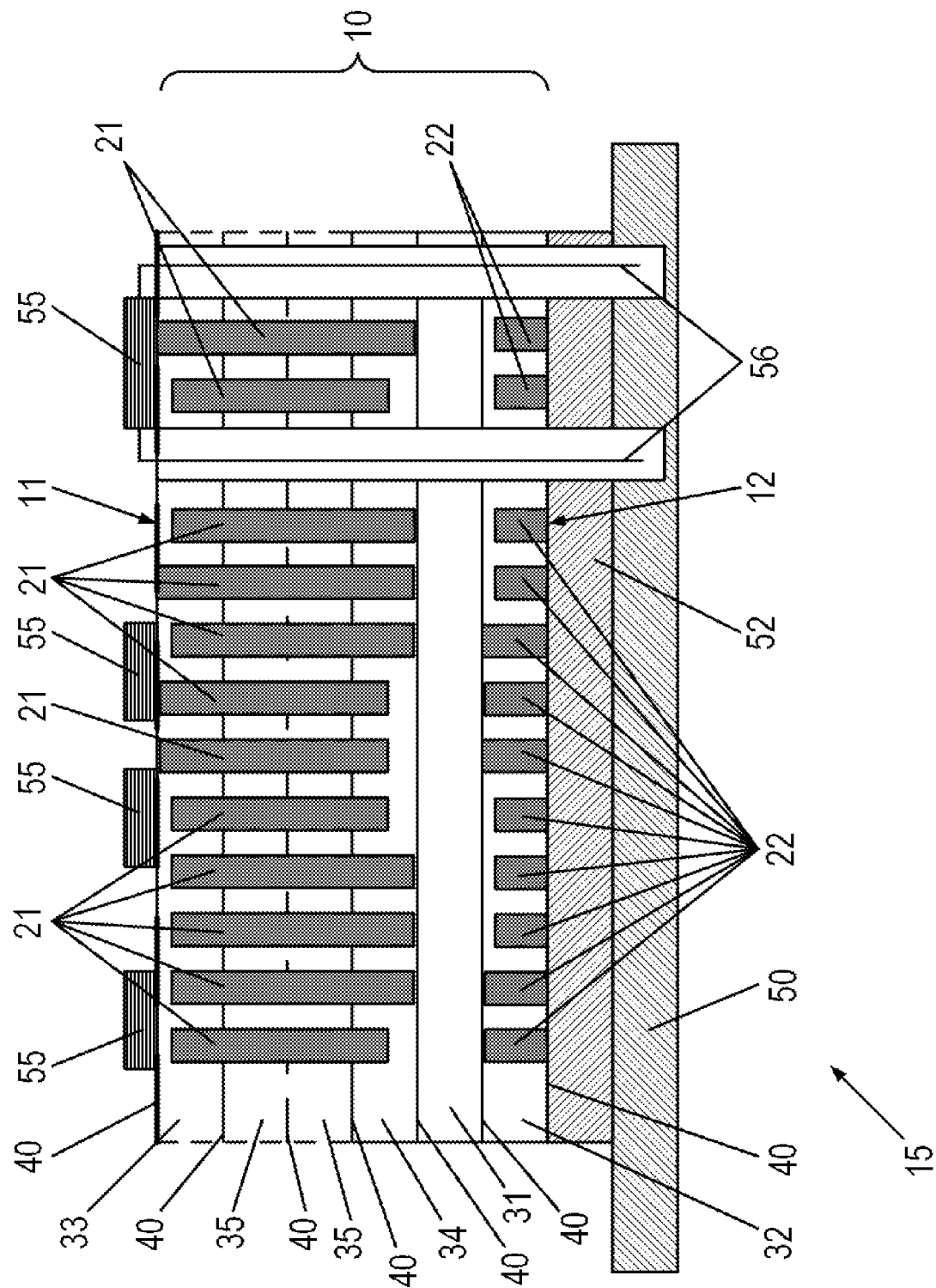

PRINTED CIRCUIT BOARD AND CIRCUIT ARRANGEMENT

FIELD OF THE INVENTION

The present invention relates to a printed circuit board and to a circuit arrangement. For example, the printed circuit board may include a top side for receiving electrical components, a bottom side for receiving a heat sink, a plurality of electrically conductive layers, and a plurality of electrically insulating insulation layers. The circuit arrangement may include a printed circuit board.

BACKGROUND INFORMATION

Printed circuit boards receive electrical components, such as, for example, resistors, capacitors, transistors, and power semiconductors. Multi-layer semiconductors have a plurality of electrically conductive layers. These electrically conductive layers have conductor tracks for interconnecting the electrical components. Provided between the electrically conductive layers are insulation layers that electrically insulate the electrically conductive layers from one another. Plated through-holes, also called vias, are for electrically connecting electrical components and conductor tracks in different electrically conductive layers.

Electrical components heat up during operation. Heat sinks are for removing the heat. Generally, heat sinks are metal, e.g., are made of aluminum, and are attached to a bottom side of a printed circuit board by a double-sided adhesive film, for example. In addition to mechanically attaching the heat sink, the adhesive film is to electrically insulate the heat sink from the printed circuit board. In addition, heat from the electrical components is to be transported through the printed circuit board to the heat sink.

A printed circuit board and a method of connecting the printed circuit board to a heat sink are described in German Patent Document No. 10 2017 223 523 A1. The printed circuit board is connected to a heat sink by a resin layer or by a plurality of resin layers. Heat conducting filler particles, which are, e.g., ceramic particles, are provided in the resin layers.

SUMMARY

Example embodiments of the present invention provide a printed circuit board and a circuit arrangement.

According to an example embodiment of the present invention, a printed circuit board includes a top side for receiving electrical components, a bottom side for receiving a heat sink, a plurality of electrically conductive layers, and a plurality of electrically insulating insulation layers. A main insulation layer is arranged between the top side and the bottom side, and the main insulation layer completely electrically insulates electrically conductive layers arranged between the main insulation layer and the top side from electrically conductive layers arranged between the main insulation layer and the bottom side. A plurality of upper plated through-holes extend at least from an outer insulation layer adjacent to the top side into an inner insulation layer adjacent to the main insulation layer. A plurality of lower plated through-holes extend at least from the bottom side into a lower insulation layer adjacent to the main insulation layer.

The voltage insulation between the electrical components on the top side and the heat sink on the bottom side is assured by the main insulation layer. An adhesive film or adhesive layer for attaching the heat sink thus does not have the task of voltage insulation, but instead is used solely to mechanically attach the heat sink to the printed circuit board. The adhesive film or adhesive layer can thus be arranged relatively thin, so that, for example, the heat conductivity of the adhesive film or adhesive layer is improved. Thus, the adhesive film or adhesive layer is also more cost effective.

Heat conduction from the electrical components on the top side to the heat sink on the bottom side is largely taken over by the upper plated through-holes and lower plated through-holes. The plated through-holes are produced from a material having good heat conduction, e.g., a metal material. Adding plated through-holes to printed circuit boards is a standard procedure in terms of manufacturing and thus can be executed with no problem. The main insulation layer is relatively thin, for example, 150 µm. Thus, the main insulation layer provides for heat conduction from the upper plated through-holes to the lower plated through-holes.

According to example embodiments, an electrically conductive layer is positioned directly against a surface of the main insulation layer facing the bottom side, and a plurality of lower plated through-holes extend from the bottom side through the lower insulation layer adjacent to the main insulation layer to the electrically conductive layer.

According to example embodiments, a plurality of lower plated through-holes that extend from the bottom side through the lower insulation layer adjacent to the main insulation layer to the electrically conductive layer are connected to the electrically conductive layer.

According to example embodiments, an electrically conductive layer is positioned against the bottom side, and a plurality of lower plated through-holes are connected to the aforesaid electrically conductive layer.

According to example embodiments, an electrically conductive layer is positioned directly against a surface of the main insulation layer facing the top side, and a plurality of upper plated through-holes extend at least from the outer insulation layer adjacent to the top side to the electrically conductive layer.

According to example embodiments, a plurality of upper plated through-holes that extend at least from the outer insulation layer adjacent to the top side to the electrically conductive layer are connected to the electrically conductive layer.

According to example embodiments, an electrically conductive layer is positioned directly against the top side, and a plurality of upper plated through-holes extend at least from the electrically conductive layer into the inner insulation layer adjacent to the main insulation layer.

According to example embodiments, a plurality of upper plated through-holes that extend at least from the electrically conductive layer into the inner insulation layer adjacent to the main insulation layer are connected to the electrically conductive layer.

According to example embodiments, the main insulation layer is passed through by at least one hole for receiving a connection wire of an electrical component.

According to an example embodiment of the present invention, a circuit arrangement includes a printed circuit board as described herein, a plurality of electrical components that are fitted to the top side of the printed circuit board and connected to the printed circuit board, and at least one heat sink that is fitted to the bottom side of the printed circuit board and is connected to the printed circuit board.

The printed circuit board in the circuit arrangement has a relatively good thermal contact resistance with simultaneously guaranteed voltage insulation between the electrical components on the top side and the heat sink on the bottom side. In addition, the circuit arrangement can be readily and cost-effectively produced.

According to example embodiments, the printed circuit board includes an electrical component with connection wires that is fitted to the top side of the printed circuit board. The connection wires of the electrical component pass through holes in the printed circuit board and are connected to the at least one heat sink on the bottom side of the printed circuit board.

Further features and aspects of example embodiments of the present invention are described in greater detail below with reference to the appended schematic FIGURE.

BRIEF DESCRIPTION OF THE DRAWING

FIG. 1 illustrates a circuit arrangement.

DETAILED DESCRIPTION

FIG. 1 schematically illustrates a circuit arrangement 15. The circuit arrangement 15 includes a printed circuit board 10, a plurality of electrical components 55, and a heat sink 50. The printed circuit board 10 has a top side 11 for receiving the electrical components 55 and a bottom side 12 for receiving the heat sink 50.

The electrical components 55 are fitted to the top side 11 of the printed circuit board 10 and are connected to the printed circuit board 10. The electrical components 55 are primarily SMD components (surface mounted devices) soldered to the top side 11 of the printed circuit board 10, but also components that have connection wires 56.

The heat sink 50 is fitted to the bottom side 12 of the printed circuit board 10 and connected to the printed circuit board 10. The heat sink 50 is attached to the bottom of the bottom side 12 of the printed circuit board 10 by a double-sided adhesive film 52. The heat sink 50 is produced from a metal material, e.g., aluminum. The heat sink 50 has recesses for receiving connection wires 56 of the electrical components 55. The recesses are dimensioned such that the connection wires 56 do not have any electrical contact with the heat sink 50.

The printed circuit board 10 includes a plurality of electrically conductive layers 40 that include, for example, copper. The electrically conductive layers 40 do not necessarily extend across the entire surface of the printed circuit board 10, but rather include, for example, only individual conductor tracks that are separated from one another.

The printed circuit board 10 also includes a plurality of electrically insulating insulation layers 31, 32, 33, 34, 35 that are arranged between the electrically conductive layers 40 and that electrically insulate at least some of the latter from one another. This means there are vias by which electrical connections are produced from a conductor track in an electrically conductive layer 40 to another conductor track in another electrically conductive layer 40.

In the printed circuit board 10, an electrically conductive layer 40 is positioned directly against the bottom side 12. A lower insulation layer 32 is attached to the electrically conductive layer 40. A further electrically conductive layer 40 is attached to the lower insulation layer 32. A main insulation layer 31 is attached to the electrically conductive layer 40.

The main insulation layer 31 is produced from prepreg, for example, and has a thickness of, for example, 150 μm. Prepreg is a layer product made of fibers or a fabric impregnated, e.g., by a resin.

In the printed circuit board 10, an electrically conductive layer 40 is positioned directly against the top side 11. An outer insulation layer 33 is attached to the electrically conductive layer 40. A further electrically conductive layer 40 is attached to the outer insulation layer 33. A further insulation layer 35 is attached to the electrically conductive layer 40. A further electrically conductive layer 40 is attached to the further insulation layer 33. A further insulation layer 35 is attached to the electrically conductive layer 40. A further electrically conductive layer 40 is attached to the further insulation layer 33. An inner insulation layer 34 is attached to the electrically conductive layer 40. A further electrically conductive layer 40 is attached to the inner insulation layer 34. The main insulation layer 31 is attached to the electrically conductive layer 40.

In the printed circuit board 10, that is, an electrically conductive layer 40 is attached directly to a surface of the main insulation layer 31 facing the bottom side 12, and an electrically conductive layer 40 is attached directly to a surface of the main insulation layer 31 facing the top side 11.

The main insulation layer 31 is thus arranged between the top side 11 and the bottom side 12 of the printed circuit board 10. The main insulation layer 31 completely electrically insulates the electrically conductive layers 40 arranged between the main insulation layer 31 and the top side 11 from the electrically conductive layers 40 arranged between the main insulation layer 31 and the bottom side 12.

This means there are no vias by means of which electrical connections that pass through the main insulation layer 31 are produced from one conductor track in an electrically conductive layer 40 to a further conductor track in a further electrically conductive layer 40. That is, the electrically conductive layers 40 arranged between the main insulation layer 31 and the top side 11 do not have any electrical connection to the electrically conductive layers 40 arranged between the main insulation layer 31 and the bottom side 12.

The printed circuit board 10 includes a plurality of lower plated through-holes 22. The lower plated through-holes 22 extend at least from the bottom side 12 into the lower insulation layer 32, which is disposed adjacent to the main insulation layer 31. A plurality of lower plated through-holes 22 are connected, e.g., soldered, to the electrically conductive layer 40 that is positioned directly against the bottom side 12.

A plurality of lower plated through-holes 22 extend from the bottom side 12 through the lower insulation layer 32 disposed adjacent to the main insulation layer 31 to the electrically conductive layer 40 positioned directly against the surface of the main insulation layer 31 that faces the bottom side 12. A plurality of lower plated through-holes 22 are connected, e.g., soldered, to the electrically conductive layer 40.

The printed circuit board 10 includes a plurality of upper plated through-holes 21. The upper plated through-holes 21 extend at least from the outer insulation layer 33 disposed adjacent to the top side 11 into the inner insulation layer 34 disposed adjacent to the main insulation layer 31.

A plurality of upper plated through-holes 21 extend at least from the electrically conductive layer 40 positioned directly against the top side 11 into the inner insulation layer 34 disposed adjacent to the main insulation layer 31. A plurality of upper plated through-holes 21 are connected, e.g., soldered, to the electrically conductive layer 40 positioned directly against the top side 11.

A plurality of upper plated through-holes 21 extend at least from the outer insulation layer 33 disposed adjacent to the top side 11 to the electrically conductive layer 40 positioned directly against the surface of the main insulation layer 31 that faces the top side 11. A plurality of upper plated through-holes 21 are connected, e.g., soldered, to the electrically conductive layer 40.

A plurality of upper plated through-holes 21 extend, e.g., through a plurality of further electrically conductive layers 40 and through a plurality of further insulation layers 35.

The upper plated through-holes 21 are electrically insulated from the further electrically conductive layers 40.

The upper plated through-holes 21 and the lower plated through-holes 22 are primarily formed of copper and solid. It is also possible for the upper plated through-holes 21 and the lower plated through-holes 22 to be arranged as hollow cylinders. The plated through-holes 21, 22 are, e.g., made of a metal material that permits good thermal conduction.

The main insulation layer 31 of the printed circuit board 10 is passed through by a plurality of holes for receiving connection wires 56 of the electrical components 55. The holes are arranged such that the connection wires 56 from the electrically conductive layers 40 positioned directly against the surfaces of the main insulation layer 31 are electrically insulated. The connection wires 56 received in the holes are also electrically insulated from the electrically conductive layer 40 positioned directly against the bottom side 12.

LIST OF REFERENCE NUMERALS

10 Printed circuit board
11 Top side
12 Bottom side
15 Circuit arrangement
21 Upper plated through-hole
22 Lower plated through-hole
31 Main insulation layer
32 Lower insulation layer
33 Outer insulation layer
34 Inner insulation layer
35 Further insulation layer
40 Electrically conductive layer
50 Heat sink
52 Adhesive film
55 Electrical component
56 Connection wire

The invention claimed is:

1. A printed circuit board, comprising:
a top side adapted to receive electrical components;
a bottom side adapted to receive a heat sink;
a plurality of electrically conductive layers;
a plurality of electrically insulating insulation layers, including a main insulation layer arranged between the top side and the bottom side, the main insulation layer completely electrically insulating the electrically conductive layers that are arranged between the main insulation layer and the top side from the electrically conductive layers that are arranged between the main insulation layer and the bottom side;
a plurality of upper plated through-holes extending at least from an outer insulation layer adjacent to the top side into an inner insulation layer adjacent to the main insulation layer; and
a plurality of lower plated through-holes extending at least from the bottom side into a lower insulation layer adjacent to the main insulation layer;
wherein one of the electrically conductive layer is positioned directly against a surface of the main insulation layer facing the bottom side, and a plurality of the lower plated through-holes extend from the bottom side through the lower insulation layer adjacent to the main insulation layer to the one of the electrically conductive layers.

2. The printed circuit board according to claim 1, wherein a plurality of the lower plated through-holes that extend from the bottom side through the lower insulation layer adjacent to the main insulation layer to the one of the electrically conductive layers are connected to the one of the electrically conductive layers.

3. The printed circuit board according to claim 1, wherein one of the electrically conductive layers is positioned against the bottom side, and a plurality of the lower plated through-holes are connected to the one of the electrically conductive layers.

4. A printed circuit board, comprising:
a top side adapted to receive electrical components;
a bottom side adapted to receive a heat sink;
a plurality of electrically conductive layers;
a plurality of electrically insulating insulation layers, including a main insulation layer arranged between the top side and the bottom side, the main insulation layer completely electrically insulating the electrically conductive layers that are arranged between the main insulation layer and the top side from the electrically conductive layers that are arranged between the main insulation layer and the bottom side;
a plurality of upper plated through-holes extending at least from an outer insulation layer adjacent to the top side into an inner insulation layer adjacent to the main insulation layer; and
a plurality of lower plated through-holes extending at least from the bottom side into a lower insulation layer adjacent to the main insulation layer;
wherein one of the electrically conductive layers is positioned directly against a surface of the main insulation layer facing the top side, and a plurality of the upper plated through-holes extend at least from the outer insulation layer adjacent to the top side to the one of the electrically conductive layers.

5. The printed circuit board according to claim 4, wherein a plurality of the upper plated through-holes that extend from the outer insulation layer adjacent to the top side to the one of the electrically conductive layers are connected to the one of the electrically conductive layers.

6. The printed circuit board according to claim 1, wherein one of the electrically conductive layers is positioned directly against the top side, and a plurality of the upper plated through-holes extend at least from the one of the electrically conductive layers into the inner insulation layer adjacent to the main insulation layer.

7. The printed circuit board according to claim 6, wherein a plurality of the upper plated through-holes that extend at least from the one of the electrically conductive layers into the inner insulation layer adjacent to the main insulation layer are connected to the one of the electrically conductive layers.

8. The printed circuit board according to claim 1, wherein the main insulation layer is passed through by at least one hole adapted to receive a connection wire of at least one of the electrical components.

9. The printed circuit board according to claim 1, wherein the heat sink is formed of metal.

10. The printed circuit board according to claim 1, wherein the heat sink is formed of aluminum.

11. The printed circuit board according to claim 1, wherein the electrical conductive layers are formed of copper.

12. The printed circuit board according to claim 1, wherein the upper plated through-holes and/or the lower plated through-holes are arranged as hollow cylinders.

13. The printed circuit board according to claim 1, wherein the lower plated through-holes and/or the lower plated through-holes are arranged as solid copper through holes.

14. A printed circuit board, comprising:
a top side;
electrical components arranged on the top side;
a bottom side;
a heat sink arranged on the bottom side;
a plurality of electrically conductive layers;
a plurality of electrically insulating insulation layers, including a main insulation layer arranged between the top side and the bottom side, the main insulation layer completely electrically insulating the electrically conductive layers that are arranged between the main insulation layer and the top side from the electrically conductive layers that are arranged between the main insulation layer and the bottom side;
a plurality of upper plated through-holes extending at least from an outer insulation layer adjacent to the top side into an inner insulation layer adjacent to the main insulation layer; and
a plurality of lower plated through-holes extending at least from the bottom side into a lower insulation layer adjacent to the main insulation layer;
wherein one of the electrically conductive layer is positioned directly against a surface of the main insulation layer facing the bottom side, and a plurality of the lower plated through-holes extend from the bottom side through the lower insulation layer adjacent to the main insulation layer to the one of the electrically conductive layers.

15. The printed circuit board according to claim 14, wherein the heat sink is attached to the bottom side by an adhesive film.

16. The printed circuit board according to claim 15, wherein the adhesive film is arranged as a double-sided adhesive film.

17. The printed circuit board according to claim 15, wherein the adhesive film electrically insulates the heat sink from the printed circuit board.

18. A circuit arrangement, comprising:
the printed circuit board according to claim 1;
a plurality of electrical components fitted to the top side of the printed circuit board and connected to the printed circuit board; and
at least one heat sink fitted to the bottom side of the printed circuit board and is connected to the printed circuit board.

19. The circuit arrangement according to claim 18, further comprising at least one electrical component having connection wires fitted to the top side of the printed circuit board, the connection wires passing through holes in the printed circuit board and not being connected to the heat sink.

* * * * *